(12) United States Patent
Subramanian et al.

(10) Patent No.: US 6,738,303 B1
(45) Date of Patent: May 18, 2004

(54) TECHNIQUE FOR SENSING THE STATE OF A MAGNETO-RESISTIVE RANDOM ACCESS MEMORY

(75) Inventors: Chitra K. Subramanian, Austin, TX (US); Bradley J. Garni, Austin, TX (US)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 10/305,736

(22) Filed: Nov. 27, 2002

(51) Int. Cl.[7] .................................................. G11C 7/02
(52) U.S. Cl. ........................ 365/209; 365/210; 365/203
(58) Field of Search ................................ 365/209, 210, 365/207, 203, 158, 189.01

(56) References Cited

U.S. PATENT DOCUMENTS 6,128,239 A * 10/2000 Perner ........................ 365/209
6,188,615 B1    2/2001 Perner \* cited by examiner

*Primary Examiner*—David Lam
(74) *Attorney, Agent, or Firm*—James L. Clingan, Jr.; Robert L. King

(57) ABSTRACT

The state of a MRAM cell is detected when the magnetic tunnel junction (MTJ) of the MRAM cell has a reduced bias from the maximum voltage that is used for biasing. In one example, the MTJ of the selected cell and the MTJ of a reference cell are both biased to a first voltage. The MTJs then discharge this bias asymptotically (RC time constant based utilizing bit line capacitance and MTJ resistance) to a lower voltage such as ground but at rates that are different for the selected cell versus the reference cell due to MTJ resistance differential. At a predetermined time the voltage differential is detected. In another example, the MTJs are precharged to a low voltage then are driven asymptotically toward a higher voltage. Thus, at the time of sensing for both cases, the voltage across the MTJ is less than the bias voltage that is being used.

28 Claims, 4 Drawing Sheets

TECHNIQUE FOR SENSING THE STATE OF A MAGNETO-RESISTIVE RANDOM ACCESS MEMORY

FIELD OF THE INVENTION

This invention relates to sense amplifiers for memories, and more particularly, to sense amplifiers for magneto-resistive random access memories (MRAMs).

RELATED ART

MRAM technology has become an attractive memory for non-volatile applications because of its high density and relatively high speed. One of the difficulties with MRAMs, however, is the relatively small difference between the high and low logic states of the magnetic tunnel junction (MTJ). The two states are distinguished by a resistance difference of about 40% at zero volts bias on the MTJ. Detecting the state of the bit requires a non-zero bias and the rate at which the signal being detected develops typically increases as the bias across the MTJ increases. As the bias across the MTJ increases, however, the resistance difference between the high and low states decreases. For example, increasing the bias across the MTJ to 300 milli Volts (mV) decreases the resistance difference to only 25%. Thus, there is a conflict between the rate of the development of the signal and the magnitude of the signal differential.

Accordingly, there is a need for a sense amplifier that at least reduces the adverse effects of this conflict.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

A sensing technique for MRAM detects the state of a MTJ, which is the memory element type used by the MRAM, during transient conditions; which are the conditions during which the MTJ either charges or discharges the associated bit line. Bit line capacitance and cell (which at least includes a MTJ) resistance determine a RC time constant for the charging or discharging of the voltage across the bit cell. In one example, the bit lines and associated parasitic capacitance to which the MTJ of the selected cell and the MTJ of a reference cell are attached are biased to a relatively higher voltage. The MTJs then discharge this bias asymptotically to a lower voltage such as ground, but the rate of discharge differs between the selected cell and the reference cell. A sense amplifier detects the voltage differential during the discharge at a predetermined time.

In another example, the bit line and associated parasitic capacitances for the MTJs are biased to at relatively lower voltage. The MTJs then asymptotically charge these bit lines to a higher voltage. Similar to the first case, the voltage across the MTJ of the selected cell decreases at a different rate than the voltage across the MTJ of the reference cell. During the decrease in voltage but before the higher voltage level is reached, the difference between the voltages across the selected MRAM cell and the reference MRAM cell is detected. Thus, at the time of sensing for both the first case and the second case, the voltage across the MTJ decreases from an initial value. Because the resistance of the MTJs increases as the bias decreases, the resistance difference between selected and reference MTJs is greater at the time of sensing than it would be if the full bias voltage was across these MTJs. This is better understood with respect to the drawings and the following description.

Figure 1:
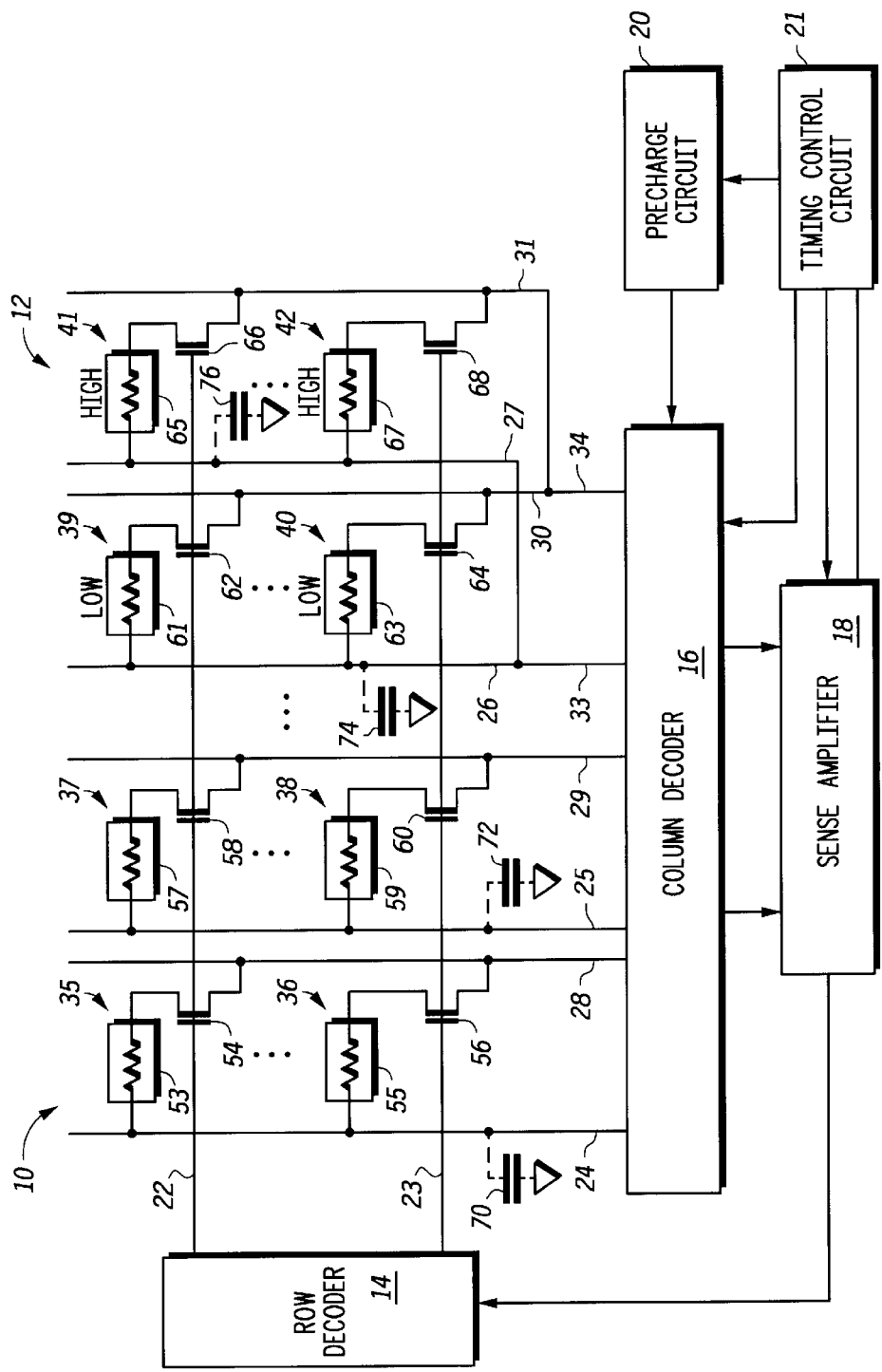
FIG. 1 is a combination block diagram and circuit diagram of a memory according to a first embodiment of the invention.

Shown in FIG. 1 is a MRAM 10 comprising an array 12, a row decoder 14, a column decoder 16, a sense amplifier 18, a precharge circuit 20, and a timing control circuit 21. Array 12 comprises a word line 22, a word line 23, a bit line 24, a bit line 25, a bit line 26, a bit line 27, a column line 28, a column line 29, a column line 30, a column line 31, MRAM cell 35, MRAM cell 36, MRAM cell 37, MRAM cell 38, MRAM cell 39, MRAM cell 40, MRAM cell 41, and MRAM cell 42.

MRAM cell 35 comprises a MTJ 53 and a transistor 54. MTJ 53 has a first terminal coupled to bit line 24 and a second terminal. Transistor 54 has first current electrode coupled the second terminal of MTJ 53, a control electrode coupled to word line 22, and a second current electrode coupled to column line 28. MRAM cell 36 comprises a MTJ 55 and a transistor 56. MTJ 55 has a first terminal coupled to bit line 24 and a second terminal. Transistor 56 has a first current electrode coupled to the second terminal of MTJ 55, a control electrode coupled to word line 23, and a second current electrode coupled to column line 28. MRAM cell 37 comprises a MTJ 57 and a transistor 58. MTJ 57 has a first terminal coupled to bit line 25 and a second terminal. Transistor 58 has a first current electrode coupled to the second terminal of MTJ 57, a control electrode coupled to word line 22, and a second current electrode coupled to column line 29. MRAM cell 38 comprises a MTJ 59 and a transistor 60. MTJ 59 has a first terminal coupled to bit line 25 and a second terminal. Transistor 60 has a first current electrode coupled to the second terminal of MTJ 59, a control electrode coupled to word line 23, and a second current electrode coupled to column line 29. These four memory cells 35–38 comprise a programmable portion of memory array 12 that is shown in two rows and two columns. It is understood that an actual memory will have many more cells in more rows and columns.

A reference portion of array 12 comprises cells 39–42. MRAM cell 39 comprises a MTJ 61 and a transistor 62. MTJ 61 is set to a low resistance state and has a first terminal coupled to bit line 26 and a second terminal. Transistor 62 has a first current electrode coupled to the second terminal of MTJ 61, a control electrode coupled to word line 22, and a second current electrode coupled to column line 30. MRAM cell 40 comprises a MTJ 63 and a transistor 64. MTJ 63 is set to a low resistance state and has a first terminal coupled to bit line 26 and a second terminal. Transistor 64 has a first current electrode coupled to the second terminal of MTJ 33, a control electrode coupled to word line 23, and a second current electrode coupled to column line 30. MRAM cell 41 comprises a MTJ 65 and a transistor 66. MTJ 65 is set to a high resistance state and has a first terminal coupled to bit line 27 and a second terminal. Transistor 66 has first current electrode coupled the second terminal of MTJ 65, a control electrode coupled to word line 22, and a second current electrode coupled to column line 30. MRAM cell 42 comprises a MTJ 67 and a transistor 68. MTJ 67 has a first terminal coupled to bit line 27 and a second terminal. Transistor 68 has a first current electrode coupled to the second terminal of MTJ 67, a control electrode coupled to word line 23, and a second current electrode coupled to column line 31. Bit lines 24, 25, 26, and 27 have parasitic capacitances 70, 72, 74, and 76, respectively, connected thereto. These are distributed capacitances that are represented by a single capacitance in this FIG. 1.

For a read operation, a selected bit line of bit lines 24 and 25 and reference bit lines 26 and 27 are precharged to a first voltage potential, preferably ground, through column decoder 16. Precharge circuit 20 provides the needed voltage to column decoder 16 under the control of timing control circuit 21, which is coupled to both precharge circuit 20 and column decoder 16 as well as sense amplifier 18 and row decoder 14. A positive bias voltage of about 500 milli Volts (mV) is applied to a selected column line and reference column lines 30 and 31 from column decoder 16 under the control of timing control circuit 21. With the bit lines precharged to ground and the column lines biased at 500 mV, a word line of word lines 22 and 23 is selected.

Using cell 35 as the selected cell as an example, word line 22 is enabled and the column of bit line 24 and column line 28 are selected. Transistors 54, 62, and 66 are enabled, which couples the bias signal, 500 mv, applied at the column lines 28, 30, and 31 to bit lines 24, 26, and 27. The voltage on bit line 24 rises at a rate based on the resistance of MTJ 53 and transistor 54 and the bit line capacitance 70. At the beginning, the voltage across MTJ 53 is based on the ratio of the resistances of MTJ 53 and transistor 54 but substantially the voltage is the bias voltage because transistor 54 is much more conductive than MTJ 53. As the voltage on bit line 24 increases, the voltage across both MTJ 53 and transistor 54 reduces. Similarly for bit lines 26 and 27, MTJs 61 and 65, and transistors 62 and 66, the bit line voltages increase and reduce the voltage across the MTJs 61 and 65. The combination of memory cells 39 and 41 combined at a reference bit line 33 and reference column line 34, provide a behavior that is approximately midway between that of a MRAM cell that is programmed to a logic high and one that is programmed to a logic low. MTJs 61 and 65 together effectively form a reference MTJ. As the bit line voltages increase with the corresponding decrease in voltage across the MTJs, the resistance difference between the reference MTJ and MTJ 53 increases. So as the voltage increases on the bit lines, the voltage difference between that on bit line 24 and reference bit line 33 will increase.

Both bit line 24 and reference bit line 33 are asymptotically heading toward the voltage on the column lines 28, 30 and 31 but at different rates based on the difference in resistance of MTJ 53 and the combination of reference MTJs 61 and 65. Thus, the bit lines first increase in difference until a maximum difference is reached and then begin decreasing in voltage difference. Sense amplifier 18 is enabled by timing control circuit 21 at the point at which the maximum voltage difference is reached. This optimum occurs after approximately one RC time constant of the average of the resistance of the high and low MTJs multiplied by the bit line capacitance. The resistance of transistor is about two orders of magnitude lower than that of the MTJ so that resistance can be ignored. Thus the voltage on the reference bit line 26 is at approximately 0.63 of the bias voltage, which 0.63 times 500 mv, which is 315 mv. Because the resistance of the MTJs is a function of voltage, the resistance portion of this calculation is itself a function of time. This complication plus complications relating to the exact capacitance of the bit lines over process variations as well as various effects on the MTJ resistance due to process variations make it most beneficial to select the actual time of sensing based on mock reference timing circuits. Another alternative is to use a programmable delay so that the actual timing is selected after the integrated circuit has been manufactured.

This approach of the sensing occurring during a decrease in voltage across the MTJ results in the voltage across the MTJ being less than the bias voltage that is generating the bit line voltage. Thus, the resistance difference between the reference MTJ and the selected MTJ is increasing at the time prior to sensing.

Figure 2:
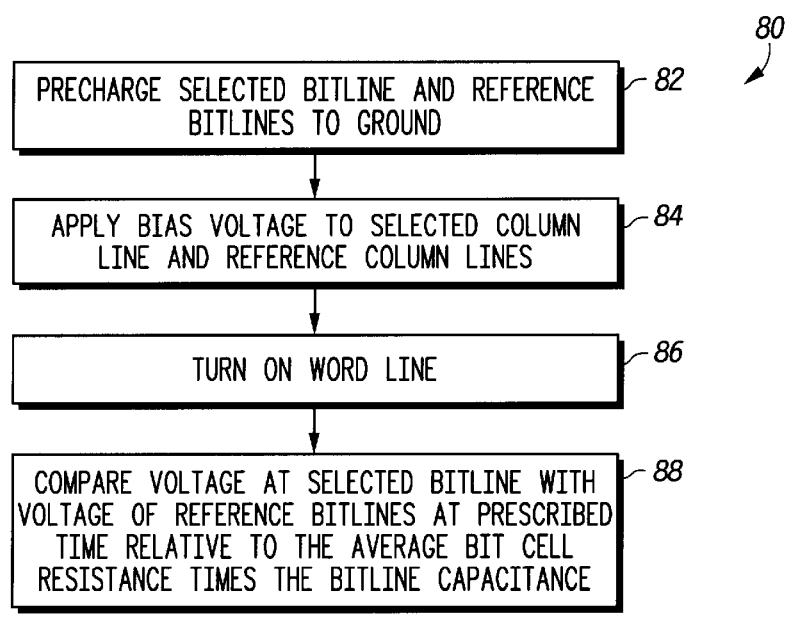
FIG. 2 is a diagram of a method for operating the memory of FIG. 1 according to the first embodiment.

FIG. 2 shows in brief the method of operation of the memory of FIG. 1 as previously described.

Figure 3:
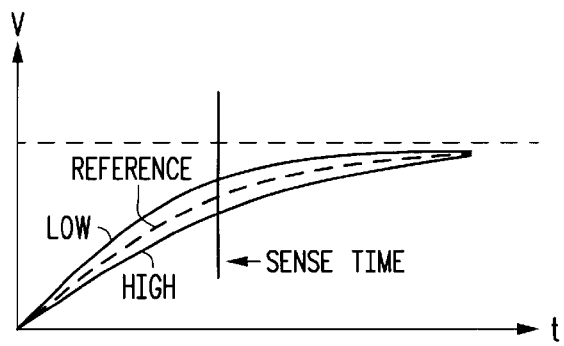
FIG. 3 is a graph of bit line voltages for different conditions of the memory of FIG. 1.

Shown in FIG. 3 is a graph of the voltage on the selected bit line and the reference bit line 33. This shows that when the resistance of the MTJ of the selected MRAM cell is low, the voltage increases asymptotically toward the bias voltage at a rate faster than that of the reference cells. The voltage on the bit line of a selected cell that has a MTJ programmed to the high resistance increases asymptotically toward the bias voltage, but at a rate slower than that of the reference cells. The reference bit line asymptotically approaches the bias voltage at a rate that is approximately midway between the low and high resistance case. This FIG. 3 also shows that the time for enabling sensing occurs when the difference between logic states is at the maximum voltage difference. As is further evident from this FIG. 3, however, precise timing is not required to obtain substantial benefit from this approach.

Figure 4:
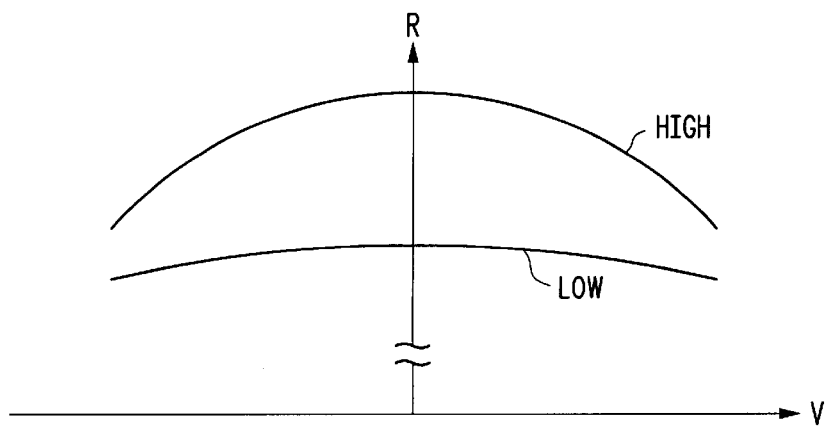
FIG. 4 is a graph of the resistance variation with bias voltage for two logic states of a MRAM cell.
Figure 5:
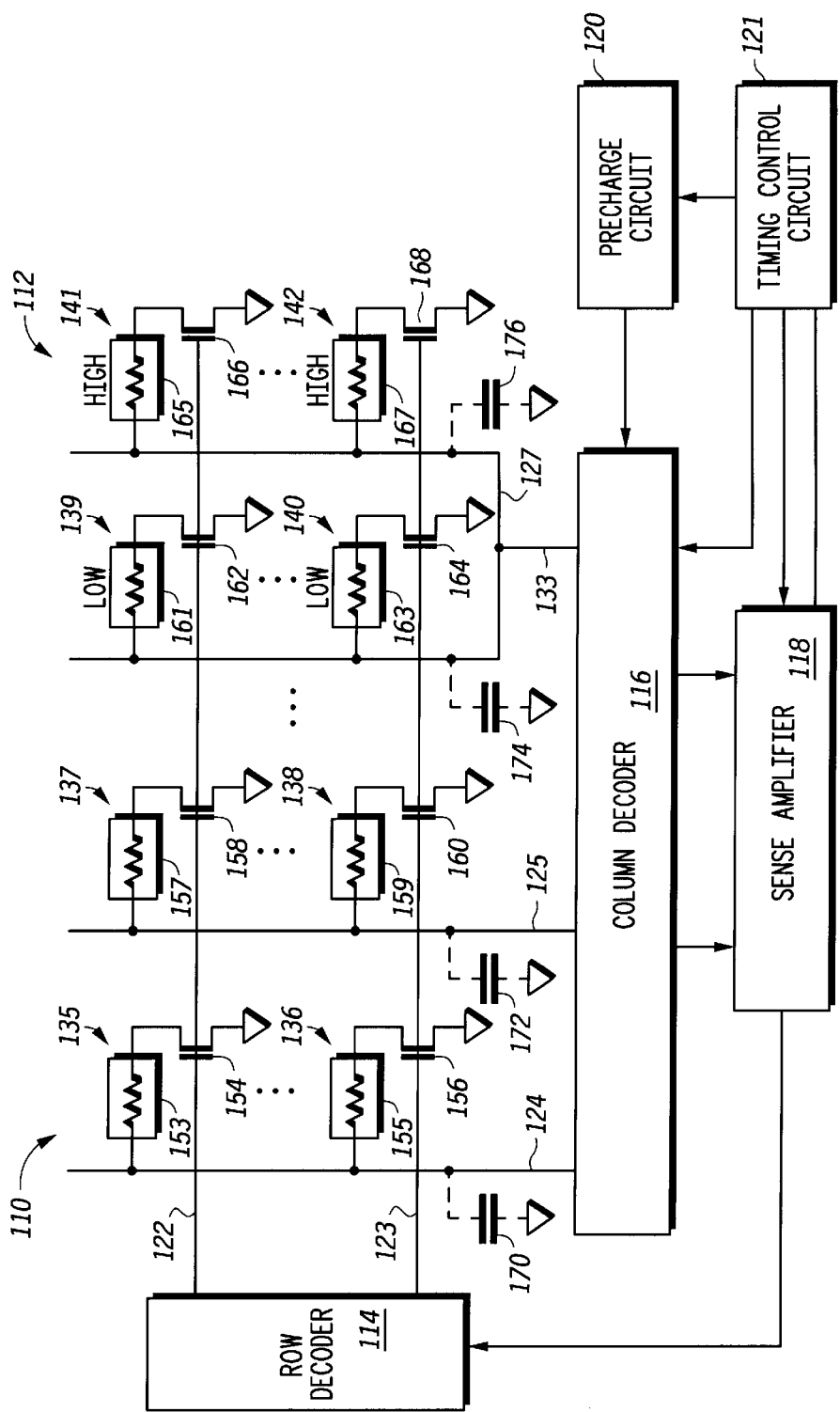
FIG. 5 is a combination block diagram and circuit diagram of a memory according to a second embodiment of the invention.

FIG. 4 shows the change in resistance with voltage across the MTJ for the logic high case and the logic low case. This is a characteristic known in the prior art. A benefit of the present invention is that at the prescribed time of sensing, the difference in resistance between states is increasing instead of decreasing or being at its minimum. This prescribed time can be a predetermined time or a time determined by another set means, for example, detecting a particular voltage level on reference bit line 33 and then sensing the difference between the reference bit line and the selected bit line. Shown in FIG. 5 is a MRAM 110 similar to that of FIG. 1. Analogous elements simply have a 1 in front of the numeral of that shown in MRAM 10 of FIG. 1. In the case of MRAM 110, there are no column lines. The previous connections to column lines are now to ground.

Figure 7:
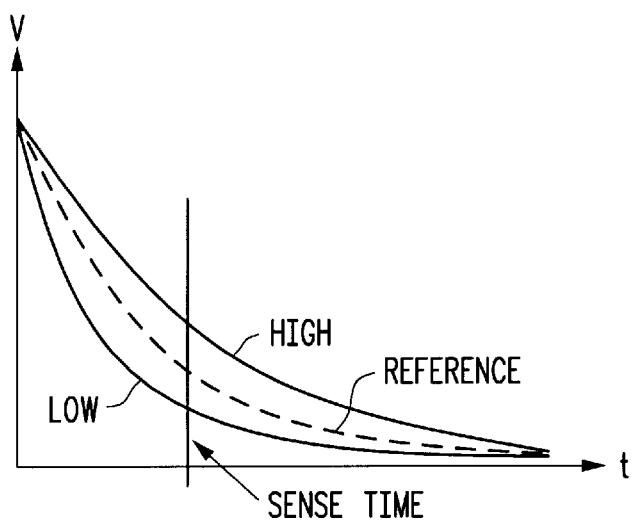
FIG. 7 is a graph of bit line voltages for different conditions of the memory of FIG. 5.

The operation of MRAM 110 is similar to that of FIG. 1 with the biggest difference being that the selected bit lines are precharged to the bias voltage, 500 mV in the present example, instead of to ground. Using cell 135 as the selected cell, word line 122 and bit line 124 are selected, which results in transistor 154 being enabled and bit line 124 precharged to the bias voltage. Enabling transistor 154 provides a discharge path through MTJ 153. The beginning voltage across MTJ 153 is approximately the bias voltage because transistor 154 is much less resistive than MTJ 153. This voltage is shown in FIG. 7 for both cases of the MTJ programmed to a high resistance state and a low resistance state. Similarly transistors 162 and 166 begin discharging reference bit cells 139 and 141 to the corresponding bit lines 126 and 127, respectively, that are tied together as reference bit line 133.

The voltage on reference bit line 133 is shown in FIG. 7 as being approximately midway between the bit line voltage for the low and high resistance states of the MTJ of the selected bit cell. As for the case of MRAM 10 of FIG. 1, the optimum time for sensing is approximately when the voltage at reference bit line 133 has been reduced by the RC time constant of the bit line capacitance and the effective reference cell resistance times the bias voltage. The reduction is thus 0.63 times 500 mV, which is 315 mV. The voltage on the bit line is thus 500 mV minus 315 mV, which is 185 mV. This can be calculated but preferably determined as described for the memory of FIG. 1 such as a mock reference timing circuits or a programmable delay.

Figure 6:
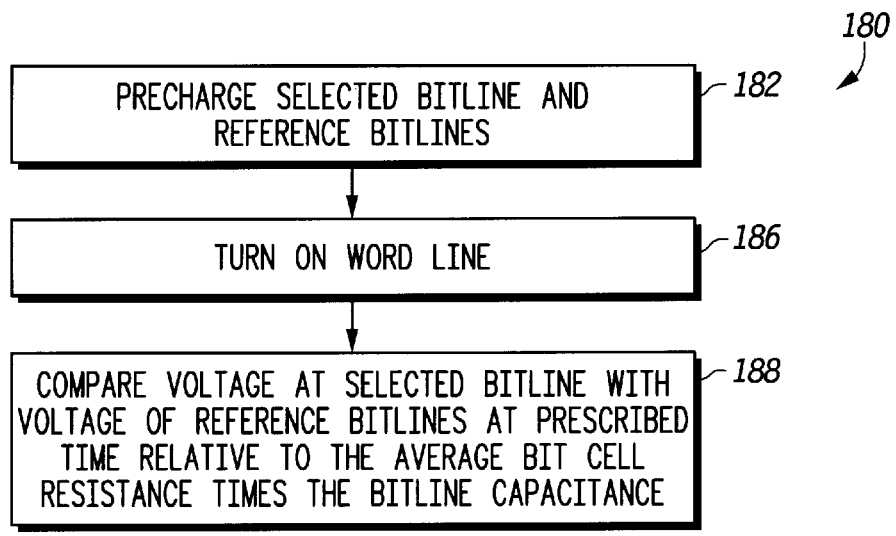
FIG. 6 is a diagram of a method for operating the memory of FIG. 1 according to the first embodiment.

FIG. 6 shows in brief the method of operation of the memory of FIG. 1 as previously described.

In the foregoing specification, the invention has been described with reference to specific embodiments. However, one of ordinary skill in the art appreciates that various modifications and changes can be made without departing from the scope of the present invention as set forth in the claims below. For example, N channel transistors are used but P channel transistors could also be used. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory device comprising:
    a plurality of memory cells;
    a bit line, the plurality of memory cells coupled to the bit line, wherein the bit line is configured to provide a voltage level during a read operation of a selected memory cell of the plurality of memory cells, wherein at the beginning of the read operation, the voltage level of the bit line is at a first voltage level and transitions towards a second voltage level at a rate dependent upon a resistance of the selected memory cell;
    a reference circuit configured to provide a voltage level during a read operation, wherein at the beginning of the read operation, the voltage level of the reference circuit is the first voltage level and transitions towards approximately the second voltage level at a reference rate;
    a sense amplifier coupled to the bit line and to the reference circuit, wherein during a read operation, the sense amplifier provides an indication of a comparison of the voltage level of the bit line and the voltage level of the reference circuit.

2. The memory device of claim 1 wherein the comparison is a comparison of the voltage level of the bit line and the voltage level of the reference circuit at a prescribed time after the beginning of the read operation.

3. The memory device of claim 1 wherein the prescribed time is dependent upon a bit line capacitance and a bit cell resistance.

4. The memory device of claim 3 wherein the prescribed time is approximately an RC time constant of a capacitance that includes the bit line capacitance and a resistance that includes the bit cell resistance.

5. The memory device of claim 1 wherein the memory cells include magneto-resistive random access memory (MRAM) cells.

6. The memory device of claim 1 wherein the bit-line is precharged to the first voltage level prior to a read operation of a selected memory cell of the plurality.

7. The memory device of claim 6 wherein the first voltage level is ground.

8. The memory device of claim 6 wherein the first voltage level is a non-ground voltage level and the second voltage level is ground.

9. The memory device of claim 1 wherein the reference circuit further includes a first reference bit line and a second reference bit line, the first reference bit line having reference cells set to a high resistive state, the second reference bit line having reference cells set to a low resistive state.

10. The memory device of claim 1 wherein at the beginning of a read operation, a voltage level across the selected memory cell is a first voltage drop level and decreases during the read operation.

11. A memory device comprising:
    a memory array having a plurality of magneto-resistive random access memory (MRAM) cells wherein each MRAM cell is coupled to a bit line of a plurality of bit lines of the array, wherein during a read operation, a voltage drop across a selected MRAM cell of the plurality decreases at a rate dependent upon the resistance of the selected MRAM cell and wherein the resistance of the selected MRAM cell increases as the voltage drop across the selected MRAM cell decreases;
    a sense amplifier coupled to at least one bit line of the plurality of bit lines and to a reference circuit, wherein during a read operation of a selected MRAM cell of the plurality, the sense amplifier is configured to compare a voltage level of a selected bit line coupled to the sense amplifier and coupled to the selected MRAM cell with the voltage level of the reference circuit while the voltage drop across the selected MRAM cell decreases.

12. The memory device of claim 11 wherein a selected bit line of the array is precharged to ground prior to a read of a selected MRAM cell coupled to the selected bit line.

13. The memory device of claim 11 wherein a selected bit line of the array is precharged to a non-ground voltage level prior to a read of a selected MRAM cell coupled to the selected bit line.

14. The memory device of claim 11 wherein the MRAM cell includes a first terminal and a second terminal, wherein during a read operation of a selected MRAM cell, the first terminal is coupled to the selected bit line and the second terminal is coupled to ground.

15. The memory device of claim 11 wherein the MRAM cell includes a first terminal and a second terminal, wherein during a read operation of a selected MRAM cell, the first terminal is coupled to the selected bit line and the second terminal is coupled to a non-ground bias source.

16. The memory device of claim 15 wherein during a read operation, the second terminal of the selected MRAM cell is coupled to the non ground bias source via a column line.

17. The memory device of claim 11 wherein the sense amplifier is configured to provide an indication of a comparison of the voltage level of the selected bit line with the voltage level of the reference circuit at a prescribed time after the voltage level across the terminals of the selected cell starts to decrease.

18. The memory device of claim 17 wherein the prescribed time is dependent upon a bit line capacitance and a bit cell resistance.

19. The memory device of claim 18 wherein the prescribed time is approximately an RC time constant of a capacitance that includes the bit line capacitance and a resistance that includes the bit cell resistance.

20. A method for reading a selected cell of a memory array, the method comprising:

precharging a bit line coupled to the selected cell to a first voltage level;

precharging a reference circuit to the first voltage level; and simultaneously allowing the bit line during a read operation to move from the first voltage level towards a second voltage level at rate dependent upon a resistance of the cell and a capacitance of the bit line and allowing the reference circuit to move from the first voltage level towards approximately the second voltage level at a reference rate;

wherein during the simultaneously allowing, comparing the voltage level of the bit line with a voltage level of the reference circuit to determine a value stored in the selected bit cell.

21. The method of claim 20 wherein the first voltage level is higher than the second voltage level.

22. The method of claim 20 wherein the second voltage level is higher than the first voltage level.

23. The method of claim 20 wherein the first voltage level is ground.

24. The method of claim 20 wherein the first voltage level is a non-ground-voltage level.

25. The method of claim 20 wherein the selected memory cell includes a magneto-resistive random access memory (MRAM) cell.

26. The method of claim 20 wherein the comparing further includes comparing voltage level of the bit line with the voltage level of the reference circuit to determine a value stored in the selected bit cell after at a prescribed time after the beginning of the read operation.

27. The method of claim 26 wherein the prescribed time is dependent upon a nominal bit line capacitance and a bit cell resistance.

28. The method of claim 26 wherein the prescribed time is approximately an RC time constant of a capacitance that includes the nominal bit line capacitance and a resistance that includes the bit cell resistance.

* * * * *